(12) United States Patent
Khalili et al.

(10) Patent No.: US 7,886,555 B2
(45) Date of Patent: Feb. 15, 2011

(54) MOBILE COMMUNICATIONS SHELTER WITH AIR DISTRIBUTION ASSEMBLY

(75) Inventors: Kaveh Khalili, Boulder City, NV (US); Uwe Rockenfeller, Boulder City, NV (US)

(73) Assignee: Rocky Research, Boulder City, NV (US)

( * ) Notice: Subject to any disclaimer, the term of this patent is extended or adjusted under 35 U.S.C. 154(b) by 657 days.

(21) Appl. No.: 11/941,842

(22) Filed: Nov. 16, 2007

(65) Prior Publication Data

US 2009/0308093 A1    Dec. 17, 2009

(51) Int. Cl.
*F25D 23/12* (2006.01)
(52) U.S. Cl. ..................................... 62/259.2
(58) Field of Classification Search ............... 62/259.2; 361/691, 695; 454/184
See application file for complete search history.

(56) References Cited

U.S. PATENT DOCUMENTS

| | | | |
|---|---|---|---|
| 5,718,628 A * | 2/1998 | Nakazato et al. ............ | 454/184 |
| 5,801,632 A | 9/1998 | Opal | |
| 6,142,866 A | 11/2000 | Wright | |
| 6,564,858 B1 | 5/2003 | Stahl et al. | |
| 6,574,104 B2 * | 6/2003 | Patel et al. ................... | 361/695 |
| 6,672,955 B2 | 1/2004 | Charron | |
| 6,705,389 B1 | 3/2004 | Stahl et al. | |
| 6,747,872 B1 * | 6/2004 | Patel et al. ................... | 361/695 |
| 6,788,535 B2 | 9/2004 | Dodgen et al. | |
| 6,859,366 B2 | 2/2005 | Fink | |
| 6,889,752 B2 | 5/2005 | Stoller | |
| 6,945,058 B2 | 9/2005 | Bash et al. | |
| 6,951,513 B1 | 10/2005 | Greenslade et al. | |
| 7,046,514 B2 | 5/2006 | Fink et al. | |
| 7,145,772 B2 | 12/2006 | Fink | |
| 7,222,660 B2 | 5/2007 | Giacoma et al. | |
| 7,719,835 B1 * | 5/2010 | Schluter ...................... | 361/695 |

* cited by examiner

*Primary Examiner*—Melvin Jones
(74) *Attorney, Agent, or Firm*—Knobbe, Martens, Olson & Bear LLP

(57) ABSTRACT

A mobile communications shelter comprising a personnel accessible chamber containing racks of stacked electronic communications equipment positioned along or adjacent to interior walls of the chamber, and a refrigeration apparatus mounted outside of the chamber and configured to supply cooled air to the chamber, is characterized by an air distribution assembly having a plurality of air ducts configured for directing cooled air supplied by the refrigeration apparatus to a plurality of selected vertical levels of the equipment.

24 Claims, 1 Drawing Sheet

MOBILE COMMUNICATIONS SHELTER WITH AIR DISTRIBUTION ASSEMBLY

BACKGROUND OF THE INVENTION

Mobile communications shelters are designed to house electronic communications equipment for many different agencies such as Army, field and combat communications centers, police and intelligence agency surveillance, and the like. The electronics equipment is typically stacked in the interior space of vans, combat vehicles such as Hummvees, communications shelters or similar mobile facilities or tents with standing racks of the equipment placed against the interior vertical walls of the space. It is important to maintain the interior of the space or at least the directed air flow in the space at a temperature necessary to maintain the equipment at desired operating temperatures and to prevent equipment shutdown or failure due to excessive interior temperature resulting in equipment temperatures leading to unreliable operation or shut-down. For this purpose, such mobile communications shelters are equipped with air conditioning equipment often mounted exterior to the equipment chamber to provide cool air which is typically directed to the chamber interior from a single or duel air outlet in the back wall. Often, it is found that the electronic communications equipment is pushed against the chamber wall, in front of, if not against, the cool air distribution vent, and otherwise stacked vertically in the chamber with one or more stacks at least partially, if not substantially, obstructing cool air from being directed to other stacks of equipment, thereby impeding and preventing proper cooling and ventilation.

SUMMARY OF THE DISCLOSURE

The mobile communications shelter described herein is characterized by an air distribution assembly cooperating with the air outlet of a mounted refrigeration apparatus or including an air outlet assembly cooperating with the evaporator of a mounted refrigeration apparatus. The assembly comprises a plurality of air ducts configured for directing cooled air supplied by the refrigeration apparatus to the racks of stacked electronic communications equipment positioned in the shelter interior and with the air distribution being adjustable to direct cool air to a plurality of selected vertical levels of the stacked equipment and to selected locations or positions within the equipment chamber. The air distribution assembly comprises one or more primary air ducts for directing air from the air outlet of the mobile shelter mounted refrigeration system and a plurality of secondary air ducts communicating with the primary air ducts. In a preferred embodiment, the secondary air ducts include one or more air vents or outlet ports configured to selectively direct and/or adjust cold air flow to selected components and heat loads. Specific details and description of the air distribution assembly are presented in the following detailed description.

DETAILED DESCRIPTION

Figure 1:
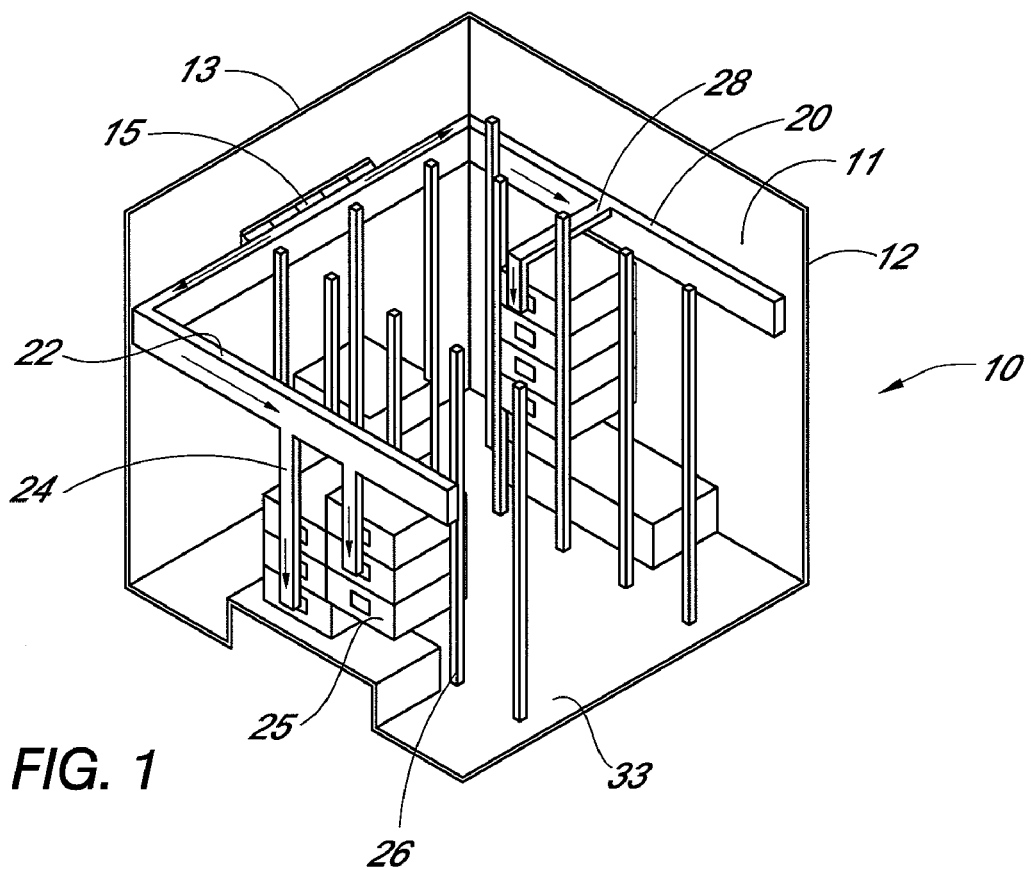
FIG. 1 is a perspective view of a mobile communications shelter with the top and two side walls removed to show the interior chamber and illustrate the components of the air distribution assembly and examples of racks and equipment layout.

In FIG. 1, two side walls and the ceiling of mobile communications shelter 10 are removed to show the interior chamber 11 in which are positioned a plurality of vertical racks 26 on which electronic communication components are stacked. The location and layout of the vertical racks is for the purpose of illustration only. In the embodiment illustrated, three sets or rows of racks are shown, with only a portion of the electronic equipment used stacked in the racks. Each of the rows of stacked equipment are adjacent to an interior wall. In the embodiment, the racks of equipment are spaced apart from the respective walls along which they are positioned, thereby providing a space between the equipment and the walls for air distribution ducts and air flow.

The shelter is provided with an air conditioner or refrigeration apparatus 18 mounted outside of the interior chamber 11. The air conditioner inlet 15 is located at end wall 13 of the shelter. Communicating with the cool air inlet 15 are primary air ducts 20 and 22 which extend generally horizontally along the interior walls. In an alternative embodiment, one or more primary air ducts may extend into the center area of the chamber, in addition to or instead of, along the interior walls. The length of a primary air duct is not critical so long as it provides adequate air supply to the secondary air ducts which communicate with and extend from the primary air duct or ducts.

Secondary air ducts are provided with vents for directing air to the interior chamber, at selected vertical and horizontal positions for maintaining the interior chamber at the desired temperature. In the embodiment shown, secondary air duct 24 extends vertically, downwardly from primary air duct 22 between an interior wall (not shown) and stack of equipment 25. Another secondary air duct 28 extends horizontally from primary air duct 20 to the front of a stack of electronic equipment, and downwardly therefrom to provide the cooling air. Any number of secondary air ducts may be used, and their respective lengths, as well as positions of air vents for directing air therefrom selected to meet the configuration and layout of the electronic equipment within the shelter. For this purpose, the secondary air ducts may comprise a plurality of connected and disengagable duct segments.

Figures 2, 3:
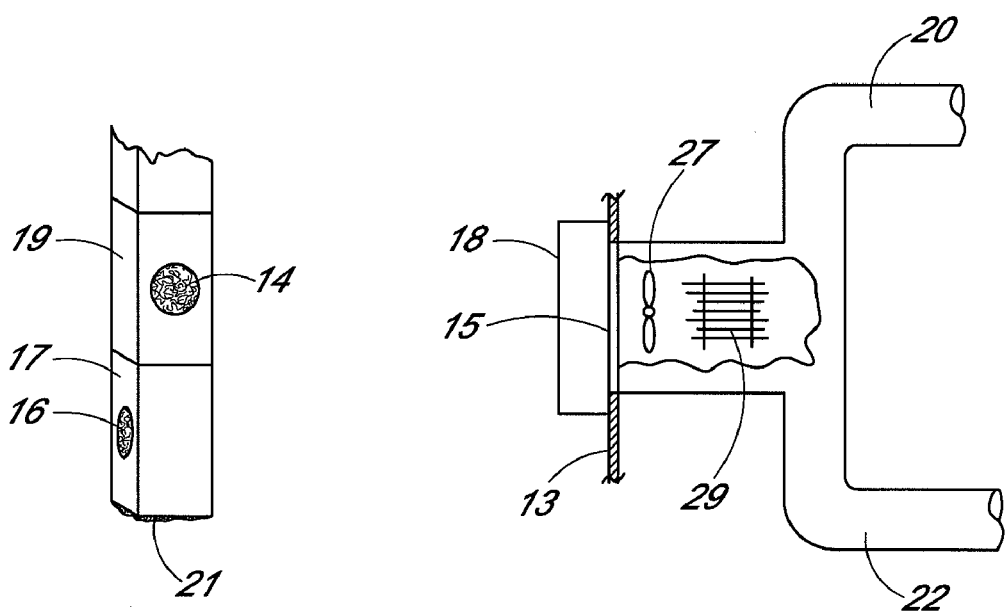
FIG. 2 illustrates a portion of a secondary air duct showing connected segments and illustrating examples of air distribution outlet ports.
FIG. 3 shows a supplemental cooling coil and fan components used with the assembly.

Also observing FIG. 2, a section of a secondary air duct is illustrated, with segments 17 and 19 connected. The secondary air duct may be shortened or lengthened by increasing or reducing the number of segments. Any number of segments of the same or different lengths may be used to accomplish the purpose of distributing the air at different vertical levels, thereby providing cooling to the equipment along the vertical racks as needed. As shown, air distribution vents 14 and 16 are on different surfaces or faces of the segments. The secondary air duct segments are preferably shaped so that the air distribution vents can be directed by simply rotating a segment to allow the air to be directed as desired. For this purpose, it may be preferred to use cylindrical air ducts and air duct segments or square or rectangular air duct segments. Moreover, the primary air ducts may also be segmented to accommodate length modifications as desired. The secondary air duct segments may be provided with a single air vent, multiple air vents, or no air vents. The air vents are preferably configured to allow adjustment of the direction and/or amount of cold air to selected equipment components and heat loads. Moreover, an air duct segment 17 may also be opened or vented at a lower end 21 to direct air downwardly, or the end of a duct may be closed, or capped, as desired.

The ends of the segments may be connected using a force-fit connection, threadedly engaging, or otherwise detachably secured to the ends of the adjacent segments using clamps, screws, clips, brackets, etc. as well. Moreover, the ducting itself may be of any suitable material such as sheet metal, plastic, or the like commonly used for air handling or air conditioning ducts.

In another embodiment of the invention, the air distribution assembly may include one or more fans positioned at the juncture of the primary air duct or ducts and the vehicular air conditioning or refrigeration cool air outlet. The use of such fans will aid in the distribution of desired amounts of cool air to the various positions in the shelter chamber where cool air is to be vented. For this purpose, a shroud, manifold or other air handling equipment component may be mounted, connected to, or added on to the described air distribution assembly. Such an added component may house the supplemental fan or fans to meet the desired air distribution demands.

In yet another embodiment, where high ambient environmental temperatures and/or equipment temperature needs dictate, a supplemental cooling system may be used, either as a stand alone heat exchange apparatus cooperating with the above described air distribution assembly to cool the shelter interior, or added as an additional component to the previously described air distribution assembly. A standalone system will have its own cooling coil or evaporator and one or more fans for providing additional cooling to the shelter chamber. Alternatively, the supplemental cooling may comprise a cooling coil or evaporator as a component of an air handler integrated into the previously described air distribution assembly for further reducing the temperature of the air from the vehicular air conditioner. The fan may be placed upstream or downstream from the cooling coil or evaporator for directing cool air into the air ducts. Chilled water, heat exchange fluid or refrigerant may be supplied to the coil or evaporator using a supplemental condenser or refrigeration system such as a vapor compression refrigeration apparatus, or a complex compound solid-gas absorption system such as described in U.S. Pat. Nos. 5,598,721, 6,224,842 and 6,736,194, the descriptions of which are incorporated herein by reference. Other supplemental cooling or refrigeration systems known to those skilled in the art may also be used. FIG. 3 illustrates such a supplemental cooling and air handling assembly attached to a shelter wall at the shelter AC cool air vent 15. The supplemental assembly incorporates a fan 27 and a cooling coil 29 to provide further cooling to the air supplied to primary air ducts 20 and 22.

What is claimed is:

1. A mobile communications shelter comprising a personnel accessible chamber containing racks of stacked electronic communications equipment positioned along or adjacent to interior walls of said chamber, and a refrigeration apparatus mounted outside of said chamber and configured to supply cooled air to said chamber, said shelter characterized by an air distribution assembly cooperating with said refrigeration apparatus comprising a plurality of air ducts configured for directing cooled air supplied by said refrigeration apparatus to a plurality of selected vertical levels of said equipment.

2. A shelter of claim 1 wherein said air distribution assembly comprises one or more primary air ducts communicating with said refrigeration apparatus cool air supply, and a plurality of secondary air ducts communicating with said one or more primary air ducts, and wherein each of said secondary air ducts is configured to deliver cooled air to one or more vertical levels.

3. A shelter of claim 2 wherein said one or more primary air ducts are mounted in said chamber and extend generally horizontal along a plane above said electronic communications equipment, and wherein said secondary air ducts extend downwardly from said one or more primary air ducts.

4. A shelter of claim 3 wherein one or more of said primary air ducts extend adjacent to interior walls of said chamber.

5. A shelter of claim 3 wherein one or more of said secondary air ducts extend horizontally from a primary air duct and downwardly in said chamber.

6. A shelter of claim 3 wherein one or more of said primary air ducts extend adjacent to one or more walls of said chamber.

7. A shelter of claim 3 wherein a said rack of stacked electronic communications equipment is spaced apart from a chamber wall and wherein a secondary air duct extends between said chamber wall and said rack of stacked electronic communications equipment.

8. A shelter of claim 6 wherein a said rack of stacked electronic communications equipment is spaced apart from a chamber wall and wherein a secondary air duct extends between said chamber wall and said rack of stacked electronic communications equipment.

9. A shelter of claim 8 wherein a first secondary air duct directs air to the back of said rack of stacked electronic communications equipment between said equipment and said chamber wall and a second secondary air duct directs air to the front of said stacked electronic communications equipment.

10. A shelter of claim 7 comprising one or more racks of stacked electronic equipment spaced apart from two or three chamber walls.

11. A shelter of claim 8 comprising one or more racks of stacked electronic equipment spaced apart from two or three chamber walls.

12. A shelter of claim 9 comprising one or more racks of stacked electronic equipment spaced apart from two or three chamber walls.

13. A shelter of claim 2 wherein at least one of said secondary air ducts comprises one or more direction and/or air flow adjustable air vents.

14. A shelter of claim 1 wherein said one or more primary air ducts comprises a plurality of detachably connected duct segments.

15. A shelter of claim 2 wherein the length of one or more of said secondary air ducts is adjustable for changing or selecting a vertical level and/or horizontal location of said one or more outlet ports.

16. A shelter of claim 15 wherein said one or more secondary air ducts comprises a plurality of disengagable connected duct segments.

17. A shelter of claim 2 wherein at least one of said secondary air ducts comprises a plurality of outlet ports and is configured to direct cool air simultaneously in two or more different lateral directions from said secondary air duct.

18. A shelter of claim 4 wherein at least one of said secondary air ducts comprises a plurality of outlet ports and is configured to direct cool air simultaneously in two or more different lateral directions from said secondary air duct.

19. A shelter of claim 12 wherein at least one of said secondary air ducts comprises a plurality of outlet ports and is configured to direct cool air simultaneously to two or more different vertical levels.

20. A shelter of claim 16 wherein one or more of said secondary air duct segments includes an outlet port for venting cool air therefrom.

21. A shelter of claim 20 wherein said one or more primary air ducts comprises a plurality of detachably connected duct segments.

22. A shelter of claim 2 wherein said air distribution assembly further comprises one or more fans cooperating with said one or more primary air ducts for supplying cool air from said refrigeration apparatus thereto and/or therealong.

23. A shelter of claim 22 further comprising one or more cooling coils or evaporators having chilled water, heat exchange fluid or refrigerant supplied thereto and wherein said one or more fans directs air in thermal communication with said one or more coils or evaporators upstream from said one or more primary air ducts.

24. A shelter of claim 2 further comprising a supplemental cooling system comprising one or more cooling coils or evaporators having chilled water, heat exchange fluid or refrigerant supplied thereto for cooling said chamber.

* * * * *